United States Patent
Steele et al.

(10) Patent No.: US 7,819,004 B2
(45) Date of Patent: Oct. 26, 2010

(54) VEHICLE SENSOR

(75) Inventors: Ryan N. Steele, Dearborn, MI (US); Scott Kerby, Wolverine Lake, MI (US)

(73) Assignee: TK Holdings, Inc., Auburn Hills, MI (US)

( * ) Notice: Subject to any disclaimer, the term of this patent is extended or adjusted under 35 U.S.C. 154(b) by 489 days.

(21) Appl. No.: 11/905,169

(22) Filed: Sep. 27, 2007

(65) Prior Publication Data

US 2008/0084005 A1   Apr. 10, 2008

Related U.S. Application Data

(60) Provisional application No. 60/827,155, filed on Sep. 27, 2006.

(51) Int. Cl.
*G01P 1/02* (2006.01)
*G01P 15/08* (2006.01)

(52) U.S. Cl. .......................... 73/493; 73/654

(58) Field of Classification Search ............ 73/493, 73/654, 865, 966.5, 866.5; 29/841, 827, 29/832
See application file for complete search history.

(56) References Cited

U.S. PATENT DOCUMENTS

| | | | |
|---|---|---|---|
| 5,703,754 A | * | 12/1997 | Hinze ..................... 361/736 |
| 6,220,163 B1 | | 4/2001 | Duguet et al. |
| 6,779,260 B1 | * | 8/2004 | Brandenburg et al. ......... 29/841 |
| 7,048,564 B1 | * | 5/2006 | Hinze ......................... 439/276 |
| 7,203,070 B2 | * | 4/2007 | Weisz-Margulescu et al. ......................... 361/752 |
| 7,294,007 B1 | * | 11/2007 | Lawlyes ..................... 439/276 |
| 7,500,394 B2 | * | 3/2009 | Steele ........................ 73/493 |
| 7,516,981 B2 | * | 4/2009 | Hollo et al. ................. 280/735 |
| 7,553,071 B2 | * | 6/2009 | Legl et al. .................... 374/28 |
| 7,616,448 B2 | * | 11/2009 | Degenkolb et al. .......... 361/752 |
| 2007/0257408 A1 | * | 11/2007 | St.Clair et al. ........... 267/64.28 |
| 2009/0127740 A1 | * | 5/2009 | Kirchner ................ 264/272.11 |

FOREIGN PATENT DOCUMENTS

| | | |
|---|---|---|
| EP | 0 875 745 A | 11/1998 |
| EP | 0 992 760 A1 | 4/2000 |
| FR | 2 860 075 A | 3/2005 |

* cited by examiner

*Primary Examiner*—J M Saint Surin
(74) *Attorney, Agent, or Firm*—Foley & Lardner LLP

(57) ABSTRACT

A vehicle sensor assembly includes a housing assembly and a printed circuit board having a plurality of electronic components provided thereon, mounted in the housing assembly. A connector interface is integrally formed with the housing assembly by a polymer overmold. The connector interface includes a shroud member. The shroud member is made of a polymer harder than the polymer overmold.

20 Claims, 3 Drawing Sheets

VEHICLE SENSOR

CROSS REFERENCE TO RELATED APPLICATIONS

This application claims priority to and the benefit of U.S. Provisional Patent Application Ser. No. 60/827,155, filed Sep. 27, 2006. The foregoing provisional application is incorporated by reference herein in its entirety.

BACKGROUND

The present invention relates generally to the field of automobile safety. Specifically, the present invention is directed to systems and methods for providing a sealed vehicle sensor printed circuit board assembly and a sealed connector interface. The printed circuit board assembly and the connector interface are both provided within an overmolded housing.

Automobile restraint systems such as airbags, tension seatbelts, etc., employ sensors in various places within the automobile to detect, for example, crash events in which the airbags or other safety equipment should be deployed. Generally speaking, a sensor is a device which senses the state of an environment. For example, a sensor can sense the surrounding temperature or pressure. With respect to automobile restraint systems, the crash sensors typically sense the automobile's acceleration to detect the crash event, although other methods for detecting the crash event can be used.

As illustrated in FIGS. 1 and 2, a typical crash sensor assembly generally includes a housing 1 of some type for protective purposes, a printed circuit board assembly 2 having sensor electronics 3 residing thereon, a mounting assembly 4 used to fasten the crash sensor assembly to the automobile body and a connector interface 5 to make electrical connection to the automobile electrical system. The printed circuit board assembly 2 is typically sealed inside the housing 1 which is made of a polybutylene terephthalate (PBT) polymer material. The PBT housing 1 also includes an integral male connector 6 with a shroud. The male connector 6 and the shroud are designed in such a way to be sealed permanently from the environment to protect the electrical interconnections. A female connector of the automobile electrical system (not shown in the drawing) typically has special seals that mate against the inside of the connector shroud and form an environmental barrier. The PBT polymer material is chosen because it is an industry standard for connectors.

After the printed circuit board assembly 2 is placed within the PBT housing 1 of the crash sensor assembly, a potting material, a sealant or a welded cover is typically placed over the opening of the PBT housing 1 to seal the contents from the ambient environment.

One drawback with the conventional crash sensor assembly is that the PBT polymer material is not particularly suited for the protection of electronic components. For example, the PBT polymer material is not particularly suited for protecting the electronic components against thermal stresses that occur within the closed area accommodating the printed circuit board assembly 2. Another drawback with the conventional crash sensor assembly is the additional cost of the potting material, sealant or welded cover, as well as the additional manufacturing step required for adding these features which increases the overall cost of the crash sensor assembly.

In view of the foregoing, there exists various needs in the art. One such need is for a crash sensor assembly that is simpler in design and still protects the electronic components against thermal stresses and the ambient environment. Another need is for a crash sensor assembly that can be manufactured at a substantially lower cost without reducing the functionality of the assembly.

SUMMARY

According to one embodiment of the present invention, a vehicle sensor assembly includes a housing assembly, a printed circuit board having a plurality of electronic components provided thereon, mounted in the housing assembly and a connector interface integrally formed with the housing assembly by a polymer overmold. The connector interface includes a shroud member. The shroud member is made of a polymer harder than the polymer overmold.

BRIEF DESCRIPTION OF THE DRAWINGS

These and other features, aspects and advantages of the present invention will become apparent from the following description, appended claims, and the accompanying exemplary embodiments shown in the drawings, which are briefly described below.

DETAILED DESCRIPTION

Embodiments of the present invention will be described below with reference to the accompanying drawings. It should be understood that the following description is intended to describe exemplary embodiments of the invention, and not to limit the invention.

According to one embodiment of the present invention, a sensor assembly includes a housing assembly and a printed circuit board having a plurality of electronic components provided thereon, mounted in the housing assembly. A connector interface is integrally formed with the housing assembly by a polymer overmold. The connector interface includes a shroud member. The shroud member is made of a polymer harder than the polymer overmold.

According to another embodiment of the present invention, a sensor assembly includes a housing assembly and a printed circuit board having a plurality of electronic components provided thereon, mounted in the housing assembly. A shroud member is formed on the housing assembly. The shroud member is made of a polymer harder than a polymer overmold of the housing assembly.

As described herein, one vehicle sensor may be a crash sensor for sensing that a vehicle is undergoing a crash or collision event. The sensor may also sense a variety of vehicle conditions such as, for example, acceleration, angular acceleration, velocity, etc. Thus, the present invention relates to a sensor assembly for vehicle sensors that utilize electronic components contained in a housing.

Figure 3:
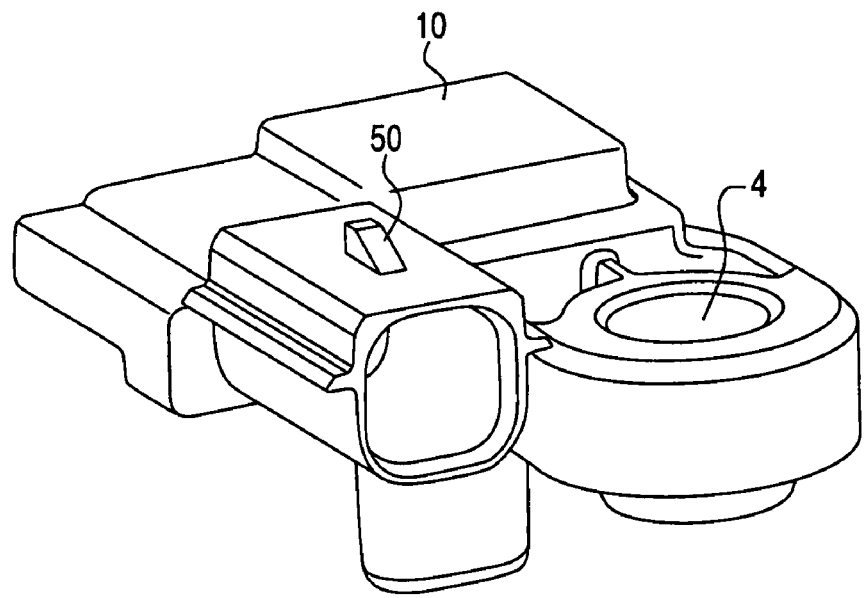
FIG. 3 is a perspective top view of a sensor assembly according to one embodiment of the present invention.
Figure 4:
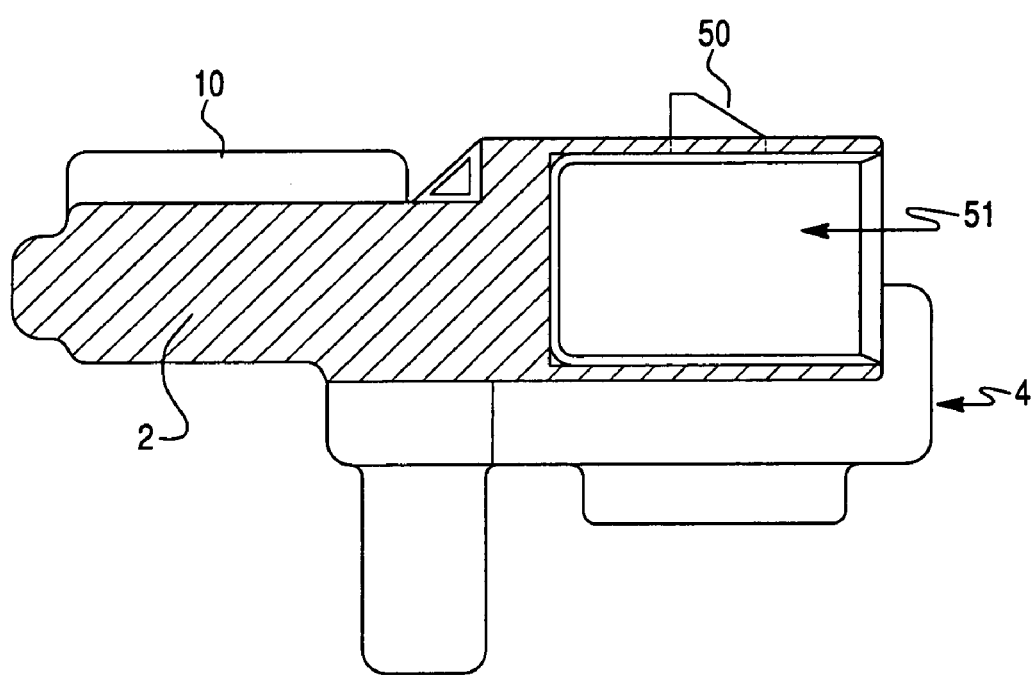
FIG. 4 is a side sectional top view of the sensor assembly according to the embodiment of the present invention.

FIG. 3 is a perspective top view and FIG. 4 is a side sectional top view of a crash sensor assembly according to one embodiment of the present invention. As illustrated in the figures, the sensor assembly includes a printed circuit board 2 including electrical components, a mounting assembly 4, a connector interface 50 and an overmold housing 10. The overmold housing 10 includes a polymer designed specifically for overmolding of electronic components.

Figure 1:
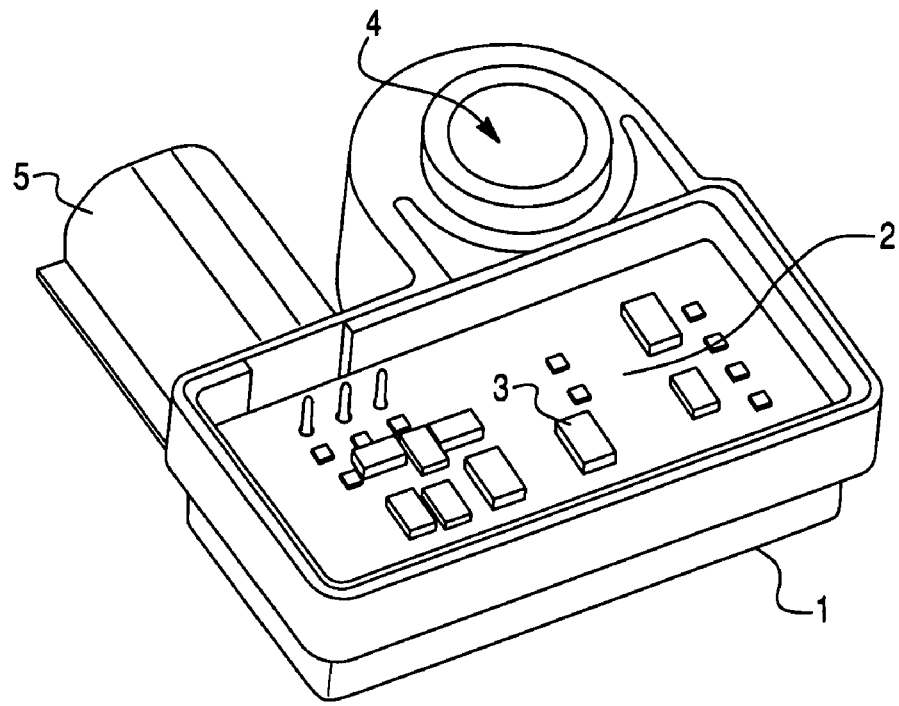
FIG. 1 is a perspective bottom view of a conventional sensor assembly.
Figure 2:
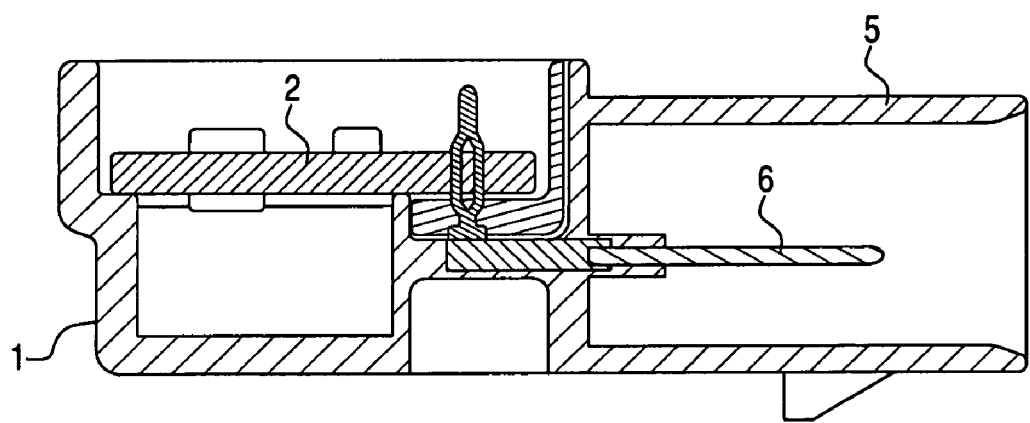
FIG. 2 is a side sectional bottom view of a conventional sensor assembly.

By way of example only, such a polymer is a low-pressure, low-temperature polyamide that solidifies as a softer material than most injection molded plastics. This soft polyamide ensures that the electronic components will not be damaged by thermal stresses, while at the same time, keeping the electronic components sealed from the ambient environment. Therefore, according to an embodiment of the present invention, the overall cost of the sensor assembly is reduced by eliminating the potting material, sealant or welded cover to protect the electronic components. The PBT housing illustrated in FIGS. 1 and 2, is replaced with the overmold housing 10 that primarily includes a polymer overmolding material suitable for overmolding electronics. The polymer used for the overmold housing 10 is not limited to the soft polyamide discussed above, but any material can be used that is molded directly over the subcomponents of the crash sensor assembly.

The connector interface 50 of the overmolded crash sensor assembly is designed to ensure that the functional intent of the connector is met. Typically, conventional crash sensor designs use sealed connectors. In order to maintain the seal of the connector mates, the two mating surfaces must be rigid. When using a soft, polyamide overmold as described above, a modified connector shroud insert has to be used to control the surface rigidity and smoothness. As best illustrated in FIG. 4, the connector interface 50 includes a connector shroud 51 made of a harder injection molded polymer, which is common to sealed connectors such as PBT. A connector locking feature that protrudes through to the outside of the connector shroud 51 also uses the harder PBT polymer material since these features usually require higher strength. The connector shroud 51 is a thin-walled PBT shroud and is often overmolded along with the printed circuit board and other components of the crash sensor assembly as illustrated in FIG. 3.

Figure 5:
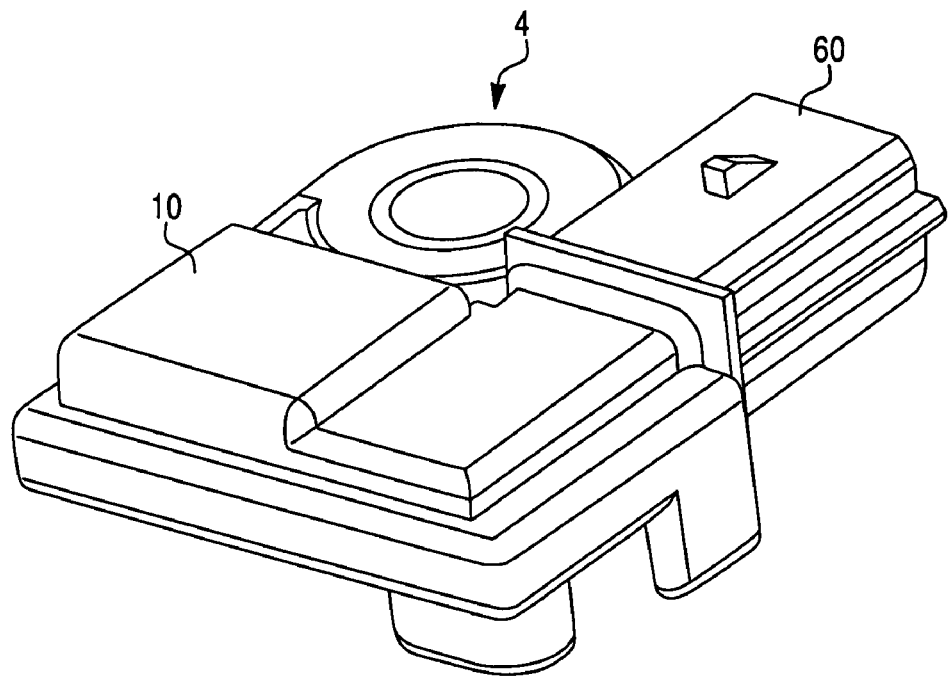
FIG. 5 is a perspective top view of the sensor assembly according to an alternative embodiment of the present invention.
Figure 6:
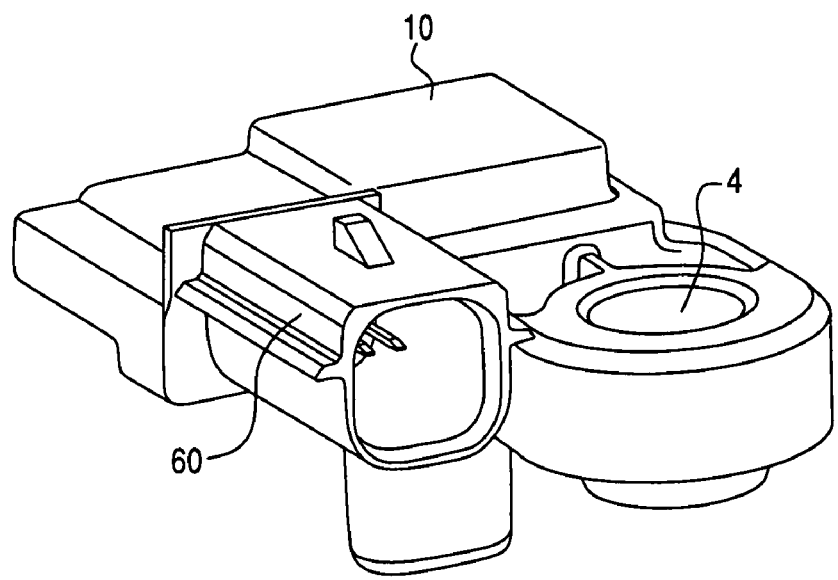
FIG. 6 is another perspective top view of the sensor assembly according to the alternative embodiment of the present invention.

FIGS. 5 and 6 are perspective top views of the sensor assembly according to an alternative embodiment of the present invention. As illustrated in the figures, the sensor assembly generally includes the mounting assembly 4 and the overmold housing 10. The sensor assembly also includes a shroud insert 60 made entirely of a PBT polymer material or similar hard polymer material and the overmold housing 10 only captures the closed end of the shroud insert 60. In addition, the shroud insert 60, whether an insert or a solid piece, could hold the electrical connectors (as in, an additional overmolded subassembly), could simply locate the electrical connectors or may not touch the electrical connectors at all.

Embodiments of the present invention are not limited to sensor assemblies but may be broadly applied to all types of electronic housings with similar connector requirements.

The foregoing description of preferred embodiments of the invention has been presented for purposes of illustration and description. It is not intended to be exhaustive or to limit the invention to the precise form disclosed, and modifications and variations are possible in light of the above teaching or may be acquired from practice of the invention. The embodiments were chosen and described in order to explain the principles of the invention and as a practical application to enable one skilled in the art to utilize the invention in various embodiments and with various modification are suited to the particular use contemplated. It is intended that the scope of the invention be defined by the claims appended hereto and their equivalents.

What is claimed is:

1. A sensor assembly for a vehicle sensor, comprising:
a housing assembly;
a printed circuit board having a plurality of electronic components provided thereon, mounted in the housing assembly; and
a connector interface integrally formed with the housing assembly by a polymer overmold,
wherein the connector interface includes a shroud member, and
wherein the shroud member is made of a polymer harder than the polymer overmold.

2. The sensor assembly of claim 1, wherein the polymer overmold is a low-pressure, low temperature polyamide.

3. The sensor assembly of claim 1, wherein the polymer overmold protects the electronic components from thermal stress.

4. The sensor assembly of claim 1, wherein the polymer overmold seals the electronic components from an ambient environment.

5. The sensor assembly of claim 1, wherein the shroud member is made of a hard injection molded polymer.

6. The sensor assembly of claim 1, wherein the shroud member includes a connector locking feature.

7. The sensor assembly of claim 6, wherein the connecting locking feature protrudes through an outside portion of the shroud member.

8. The sensor assembly of claim 1, wherein the shroud member is a thin-walled polybutylene terephthalate polymer shroud.

9. The sensor assembly of claim 1, further comprising a mounting assembly configured to be fastened to a vehicle body.

10. A crash sensor assembly, comprising:
a housing assembly;
a printed circuit board having a plurality of electronic components provided thereon, mounted in the housing assembly; and
a shroud member formed on the housing assembly,
wherein the shroud member is made of a polymer harder than a polymer overmold of the housing assembly.

11. The crash sensor assembly of claim 10, wherein the polymer overmold is a low-pressure, low temperature polyamide.

12. The crash sensor assembly of claim 10, wherein the polymer overmold protects the electronic components from thermal stress.

13. The crash sensor assembly of claim 10, wherein the polymer overmold seals the electronic components from an ambient environment.

14. The crash sensor assembly of claim 10, wherein the shroud member is made of a hard injection molded polymer.

15. The crash sensor assembly of claim 10, wherein the shroud member includes a connector locking feature.

16. The crash sensor assembly of claim 15, wherein the connecting locking feature protrudes through an outside portion of the shroud member.

17. The crash sensor assembly of claim 10, wherein the shroud member is a thin-walled polybutylene terephthalate polymer shroud.

18. The crash sensor assembly of claim 10, further comprising a mounting assembly configured to be fastened to the vehicle.

19. The crash sensor assembly of claim 10, wherein the polymer overmold is only molded around a closed end portion of the shroud member.

20. A method for overmolding a crash assembly, comprising:
mounting a printed circuit board having a plurality of electronic components provided thereon, in a housing assembly;
forming a connector interface with the housing assembly by a polymer overmold; and
providing a shroud member in the connector interface made of a polymer harder than the polymer overmold.

* * * * *